United States Patent
Ellegaard (10) Patent No.: US 9,024,209 B2
(45) Date of Patent: May 5, 2015

(54) TERMINAL BOX FOR THE ELECTRIC CONNECTION TO AN ELECTRIC MOTOR

(75) Inventor: Jorgen Ellegaard, Ry (DK)

(73) Assignee: Grundfos Management a/s, Bjerringbro (DK)

( * ) Notice: Subject to any disclaimer, the term of this patent is extended or adjusted under 35 U.S.C. 154(b) by 429 days.

(21) Appl. No.: 13/059,339

(22) PCT Filed: Aug. 27, 2009

(86) PCT No.: PCT/EP2009/006229
§ 371 (c)(1),
(2), (4) Date: Feb. 16, 2011

(87) PCT Pub. No.: WO2010/031492
PCT Pub. Date: Mar. 25, 2010

(65) Prior Publication Data
US 2011/0147077 A1    Jun. 23, 2011

(30) Foreign Application Priority Data
Sep. 16, 2008   (EP) .................................... 08016315

(51) Int. Cl.
*H05K 7/02*  (2006.01)
*H02K 11/00* (2006.01)
*H02K 5/22*  (2006.01)
(Continued)

(52) U.S. Cl.
CPC ............ *H02K 11/0073* (2013.01); *H02K 5/225* (2013.01); *H05K 7/1417* (2013.01); *H05K 5/0069* (2013.01); *H05K 5/006* (2013.01)

(58) Field of Classification Search
USPC .................. 439/76.1, 76.2; 174/541, 559
See application file for complete search history.

(56) References Cited

U.S. PATENT DOCUMENTS 6,317,332 B1   11/2001   Weber et al.
6,445,584 B1   9/2002    Riehl et al.
(Continued)

FOREIGN PATENT DOCUMENTS

CN    1336095 A       2/2002
DE    199 53 191 A1   5/2001
(Continued)

OTHER PUBLICATIONS

Int'l Search Report issued on Oct. 12, 2009 in Int'l Application No. PCT/EP2009/006229.
(Continued)

*Primary Examiner* — Hung V Ngo
(74) *Attorney, Agent, or Firm* — Panitch Schwarze Belisario & Nadel LLP (57) ABSTRACT

A terminal box (45) for electrical connection to an electric motor (32), in particular of a circulation pump (10), includes at least one wall (215) and at least one circuit board (145), wherein the terminal box (45) on the wall (215) includes at least one electrical contact (220) for connection to the circuit board (145), said contact designed as a clamping element (220) for releasably clamping the circuit board (145) which is orientated with its flat sides (150, 152) perpendicularly to this wall (215). A terminal box system includes at least two different circuit boards (145, 145') selectively insertable into the at least one clamping element (220) of the terminal box (45) and/or at least two different covers (105, 105') selectively connectable to a housing part (100) of the terminal box (45). A pump assembly (5) includes such a terminal box (45) or such a terminal box system.

17 Claims, 8 Drawing Sheets

(51) Int. Cl.
*H05K 7/14* (2006.01)
*H05K 5/00* (2006.01)

(56) References Cited

U.S. PATENT DOCUMENTS

| | | |
|---|---|---|
| 6,642,633 B1 | 11/2003 | Yang |
| 6,663,401 B2 * | 12/2003 | Billman et al. .............. 439/76.1 |
| 6,896,536 B1 | 5/2005 | Nguyen et al. |
| 7,268,447 B2 | 9/2007 | Russel et al. |
| 2003/0039107 A1 | 2/2003 | Modi |
| 2007/0072452 A1* | 3/2007 | Inagaki et al. ............... 439/76.2 |
| 2007/0109748 A1 | 5/2007 | Neise |

FOREIGN PATENT DOCUMENTS

| | | |
|---|---|---|
| DE | 101 62 405 A1 | 7/2003 |
| DE | 10 2005 042 696 A1 | 3/2006 |
| DE | 10 2006 025 977 A1 | 12/2007 |
| EP | 1 659 837 A1 | 5/2006 |
| GB | 2 336 254 A | 10/1999 |
| WO | 97/16883 A1 | 5/1997 |
| WO | 2005/028834 A1 | 3/2005 |

OTHER PUBLICATIONS

Office Action issued Jul. 1, 2013 in CN Application No. 200980136137.7.

\* cited by examiner

TERMINAL BOX FOR THE ELECTRIC CONNECTION TO AN ELECTRIC MOTOR

CROSS-REFERENCE TO RELATED APPLICATIONS

This application is a Section 371 of International Application No. PCT/EP2009/006229, filed Aug. 27, 2009, which was published in the German language on Mar. 25, 2010, under International Publication No. WO 2010/031492 A1 and the disclosure of which is incorporated herein by reference.

BACKGROUND OF THE INVENTION

Embodiments of the invention relate to a terminal box for electrical connection to an electric motor, in particular of a centrifugal pump, to a terminal box system with such a terminal box, as well as to a pump assembly.

Terminal boxes are usually provided for electrical connection of electric motors, in particular electric motors of circulation pumps. In addition to the pure connection elements, one may arrange further electronic components for controlling the electric motor, in these terminal boxes. Moreover, depending on the scope of the function, one may also arrange components or interfaces for the communication or control of further assemblies, in the terminal box.

It is desirable to provide a terminal box of the initially mentioned type, which may be manufactured and constructed in a simpler and less expensive manner. Moreover it is also desirable to provide an inexpensively manufacturable pump assembly.

BRIEF SUMMARY OF THE INVENTION

The terminal box according to an embodiments of the invention is provided for electric connection to an electric motor, in particular of a circulation pump. The terminal box includes at least one wall and at least one circuit board. Preferably thereby, the wall forms a part of the housing of the terminal box. Basically, the wall may however also be part of a component introduced into the housing, with which the wall in particular is arranged in a stationary manner to the housing. The terminal box on the wall includes at least one electrical contact for the connection to the circuit board, said contact being designed as a clamping element for the releasable clamping of the circuit board orientated with its flat sides perpendicularly to this wall. A circuit board in the context of embodiments of this invention may thereby carry electrical or electronic components, for example for the control and/or for monitoring the electric motor. The circuit board may be assembled in the terminal box according to the invention in a particularly simple manner with the electrical contact designed as a clamping element. Moreover, the circuit board may be contacted simultaneously with the assembly, and thus in a particularly simple electrical manner. In this manner, the circuit board does not need to be electrically contacted in an individual assembly step. Rather, the electrical contacting and the mechanical fixation may be effected in a single assembly step by way of inserting the circuit board into the clamping element. Thus one may save an assembly step on construction of the terminal box. The releasable clamping of the circuit board moreover permits a simple exchange of the circuit board, since with the release of the circuit board from its clamping, its electrical contacting may be interrupted in a simple and reversible manner. With regard to the previously mentioned contact, it does not necessarily need to be the case of a single electrical contact. Rather, the electrical contact in the context of this invention may also include a contact field with a multitude of electrical contacts.

Preferably, the circuit board is not merely clamped in an orientation with its flat sides perpendicular to the wall, but may also be displaced into its clamping position with its flat sides orientated perpendicular to the wall. Such a design significantly simplifies the assembly of the terminal box, since only a linear movement of the circuit board directed to the wall is necessary. A release of the circuit board from the terminal box for an exchange of the circuit board is also accomplished in a similarly simple manner. Such a design is particularly advantageous for terminal box systems as are described hereinafter.

Preferably, with regard to the terminal box, the clamping element is designed as a pair of resilient clamping tongues which extend perpendicularly away from the wall and by way of which the circuit boards are clamped on their flat sides. Thereby, a clamping tongue extending perpendicular to the wall is to be understood in that it comprises a resilient lug orientated perpendicularly to the wall. Thereby, the clamping tongues may also comprise projections, in particular on sections distanced to the wall, on the resilient lugs, which are for example directed towards the flat sides of the circuit board on clamping a circuit board. Preferably, the clamping tongues lie opposite one another, so that the circuit board may be clamped between both clamping tongues. Advantageously, a circuit board in this design may be moved between the clamping tongues into its clamping position perpendicularly to the wall, so that only a linear movement is necessary, in order to arrange the circuit board in the terminal box.

Preferably, with regard to the terminal box, the circuit board, on at least one of its flat sides, includes at least one electrical contact for connection to the clamping element, which is arranged close to a side edge of the circuit board. In such a design, the at least one electrical contact on the circuit board may be designed as a part of a strip conductor running on a flat side of the circuit board. This design permits a particularly simple manufacture of the circuit board. Thereby, preferably the at least one electrical contact is designed as a flat contact. Corresponding to this, the pair of resilient clamping tongues has at least one contact region, which for example may be designed as a plane contact surface or as a contact surface which is arcuate on one or both sides, for example as a projection. One may realise a surface contact, line contact or point contact for electrical contacting of the circuit board in this manner.

Preferably, with regard to the terminal box, the clamping element is cast into the housing of the terminal box. In this manner, the terminal box may be manufactured in a particularly simple and inexpensive manner, since the clamping element does not have to be positioned and fixed on the housing in a manufacturing step which is specially provided for this. Rather, the manufacture of the housing and the arrangement of the clamping element on the housing may be effected in a single manufacturing step by way of peripherally casting or peripherally injecting the clamping element when manufacturing the housing. For this, the housing is usefully manufactured of plastic and as an injection moulded part. Thereby, it is not necessary for the complete housing to be manufactured of plastic or as an injection moulding part. The injection moulded part may thereby only form a part of the housing of the terminal box, which encompasses the region of the wall on which the clamping element is arranged.

Further preferably, with regard to the terminal box, the clamping element is part of a strip conductor system, which is cast into the housing or into a first housing part of the terminal box. In this manner, with the manufacture of the terminal box, one may do away with an electrical contacting of the clamping element in a further manufacturing step.

In a particularly preferred design, the strip conductor system includes at least one of the following components: an electrical plug contact region for the connection of the electric motor, an electrical plug contact region for the connection to a voltage source, a stationary electrical contact of an operating switch, and electrical contact for the connection of a capacitor, an earthing element. Ideally, all electrical connections and contacts of the terminal box are cast into the housing. Thus one may do away with a complicated wiring or additional circuit boards with the required electrical connections. Moreover, with regard to the electrical contact of an operating switch, it is preferably the case of such a contact of an operating switch as is described hereinafter.

Preferably, the terminal box includes a holding device for the clamping of a capacitor, said device being formed of an elastic plastic. In one design, a terminal box cast of plastic together with the holding device for clamping a capacitor, may be manufactured with multi-component injection moulding, wherein the housing forms a first component and the holding device forms a second component of a multi-component injection moulding part. However, it is also possible to insert the holding device as a separate component into a corresponding receiver into the terminal box.

Further preferably, the terminal box moreover includes a first housing part and a cover which is releasable therefrom, with a seal lying therebetween, wherein the seal and the holding device are formed of the same material, and together with the first housing part of the terminal box, are formed as a multi-component injection moulding part. In this design, the seal and the holding device may be formed together in a single manufacturing step. The elastic elements such as holding device and seal as well as further elements, as the case may be, may thus be connected to the housing of the terminal box by injection moulding. Accordingly, one may save a manufacturing step compared to a separate design of the seal and holding device.

In a preferred design, the terminal box comprises a first housing part and a cover which is releasable from this, wherein the circuit board is fastened on the cover. Usefully thereby, the wall with the clamping element for the releasable clamping of the circuit board is arranged in the first housing part. The terminal box may be assembled in a particularly simple manner with a housing designed in such a manner. Thus the insertion as well as the electrical contacting of the circuit board may be effected in a simple manner by way of placing the cover onto the first housing part. The cover for this may usefully be applied onto the first housing part in the direction of the flat sides of the circuit board.

Further preferably, the terminal box includes a first housing part and a cover which is releasable therefrom, wherein at least one electrical contact together with at least one strip conductor is arranged on the cover. Preferably, the electrical contact together with the at least one strip conductor is cast into the cover. In this advantageous embodiment, the contact of the cover may come into electrical contact with the circuit board. Alternatively, as the case may be, strip conductor systems of the first housing part and of the cover may be connected to one another or also further components may be connected to the terminal box, via the contact. The cover may be manufactured with the contact and the strip conductor in a single manufacturing step by way of casting in the electrical contact together with the at least one strip conductor. For this reason, one may do away with a fixation of the electrical contact on the cover and a subsequent contacting of the contact in further manufacturing steps.

Particularly preferably, the terminal box includes a first housing part and a cover which is releasable therefrom, wherein at least one cable lead-through and/or one electrical plug contact is arranged on the cover. The terminal box may be electrically connected to an external apparatus, for example to a control apparatus, with the cable lead-through and/or the electrical plug contact. In the case of a terminal box for the electrical connection to an electric motor of a centrifugal pump, with regard to the external apparatus, it is particularly preferably the case of an exchange pump or of a further pump assembly. With regard to the cover of the terminal box, it may particularly be the case of an optional cover of two covers of a terminal box system, as is described hereinafter.

The terminal box is preferably designed in a manner such that the clamping element for the circuit board is arranged in a first housing part which is provided for connection to the electric motor. Such a motor-side housing part of the terminal box forms a base part of the housing of the terminal box. Advantageously all important electrical connections may be situated in the motor-side housing part or in the base part with such a design, so that the required strip conductor system may remain restricted merely to the motor-side housing part or the base part of the housing.

Preferably, with regard to the terminal box, the circuit board includes a controllable switch, which includes at least one control contact and at least one switch contact. Thereby, the control contact is connected to an electrical plug contact region for the connection of the electric motor, and the switch contact is connected to the electrical contact region of the terminal box. In this manner, one may lead an electrical signal to an electrical contact region of the terminal box, which for example indicates whether the electric motor is supplied with electricity. For example, a signal may be given via the electrical contact region of the terminal box when the electric motor obtains no electricity or has failed. In particular, an exchange pump or a further pump assembly may be connected to the electrical contact region of the terminal box in the case of a terminal box for the connection to an electric motor of a circulation pump, wherein the electrical signal switches on or actuates the exchange pump or the further pump assembly. In this manner one may increase the operational reliability of a pump assembly. With regard to the controllable switch of the circuit board, e.g. a relay, it may in particular be the case of an optional component for an addition function as described previously, which is provided on one of at least two circuit boards of a terminal box system, as is described hereinafter.

Preferably, the terminal box includes at least one housing part designed as a plastic cast part, and an operating switch, wherein the operating switch is arranged on the housing part and at least one stationary electrical switch contact of the operating switch is cast into the housing part. In this manner, it is possible to form a part of the operating switch by the housing part of the terminal box. With this, it is not necessary to assemble the switch on a circuit board as a separate component. Accordingly, one may do without a complicated, for example mechanical connection of operating elements arranged on the housing of the circuit board and the switch on a circuit board. Moreover, the manufacture of the housing part is particularly simple. Thus a further manufacturing step for fixing the switch contact on the housing part may be done away with, by way of the casting of the electrical switch contact into the housing part.

Preferably, with regard to the terminal box, the operating switch includes several stationary switch contacts. Designed in this manner, the operating switch may assume more than two switch positions.

Further preferably, the operating switch includes a moving part which includes a moving switch contact of the operating switch. The moving contact of the operating switch may then come into electrically conductive connection with the stationary electric switch contact. Particularly preferably, the moving part of the operating switch has two moving switch contacts which are conductively connected to one another and which are arranged on the moving part of the operating switch in a manner such that two of the stationary electrical switch contacts may come into electrically conductive connection with the two moving electrical switch contacts. Thus two of the stationary electrical switch contacts of the housing part are connected to one another in a conductive manner by way of the moving part of the operating switch. In this design, the operating switch may be designed as a change-over switch, by way of different pairs of stationary electrical switch contacts being conductively connected to one another, depending on the position of the moving part of the operating switch.

Usefully, with regard to the terminal box, a spring element, which impinges the moving part of the operating switch with force in the direction of the housing part, is arranged on the operating switch. Thus the moving part of the operating switch is held on the housing and thus close to the stationary electrical contacts, so that the moving switch contacts of the moving part of the operating switch, come into conductive connection with the stationary switch contacts at a suitable switch position.

Further preferably, the moving part of the operating switch is connected to the housing part in a moving manner via a locking connection. In this manner, the terminal box may be assembled in a particularly simple manner on manufacture, since for assembly, the moving part of the operating switch merely needs to be inserted into a receiver provided on the housing. The operating switch is thereafter held in this position in a rotationally movable manner via the locking connection. In a preferred design, with regard to the terminal box, the operating switch is a rotary switch. In particular, the moving part of the rotary switch is a cylindrical rotation body.

Preferably, two switch contacts which are rotatably movable together with the rotation body are arranged on a housing-side end-wall of the rotary switch diametrically about the central rotation axis or longitudinal axis of the rotation body, and these switch contacts may come into conductive contact with the stationary electrical switch contacts which are arranged on the housing part. For this, the stationary electrical switch contacts are preferably distributed around the rotation axis of the rotation body on the housing part in a manner such that a first stationary switch contact extends peripherally about roughly half the periphery about the rotation axis. The remaining switch contacts thereby are distributed with the same distance to one another and with the same distance to the rotation axis about the remaining periphery about the rotation axis. These remaining switch contacts thereby extend about significantly smaller parts of the periphery than that of the first switch contact. Thus on rotation of the rotation body, the first moving switch contact brushes on the first stationary electrical switch contact, whilst the second moving switch contact is conductively connectable to each of the remaining stationary contacts by way of rotating the rotation body. Further preferably, with regard to the terminal box, the operating switch is a rotational speed selection switch of the electric motor connected to the terminal box.

In a preferred design, the terminal box is designed in a manner such that the operating switch includes a display element. The display element for example is provided for the display of the operating condition of the electric motor.

Particularly preferably, the display element is a light display. Advantageously, in this design, the terminal box comprises a light component and a light guide. Thereby the light component and the light display are connected to one another in a light-leading manner by way of the light guide. In this manner, the light component may be distanced to the light display, for illuminating the light display. Ideally, the light component is a light diode which is arranged on a circuit board, in particular the circuit board described above. Thus the circuit board with the light component may be arranged in the inside of the terminal box distanced further to its housing wall.

Preferably thereby, a part of the operating switch, in particular the shaft of a rotary switch, forms at least a part of the light guide. If the shaft of a rotary switch forms at least a part of a light-guide, then the light path through the light-guide does not shift, even with a change of the rotary position of the rotary switch. Accordingly, the illumination of the light display remains uninfluenced by an actuation of the rotary switch. Preferably, the light-guide or one of its parts is designed as a transparent light-leading plastic element. Alternatively, the light-guide may be designed as a simple axial opening, i.e. an axial lead-through. Thus the shaft may be tubular.

Further preferably, with regard to the terminal box, individual strip conductors of the strip conductor system are connected to one another in an insulating manner before casting into the housing part. In this manner, the strip conductors may be cast into the housing part in an extremely simple manner on manufacture of the terminal box. Thus the strip conductors by way of the insulating connection, may be cast into the housing part as a single-piece module or one which may be handled as one part, particularly if the connection is designed as a rigid connection. In particular, the strip conductors do not need to be aligned or positioned individually in the tool before the casting of the housing part when manufacturing the terminal box. Rather, the module part which may be handled as one piece or one part, merely needs to be inserted and aligned into the tool.

The terminal box system according to an embodiment of the invention includes such an initially described terminal box. Thereby, the terminal box system includes at least two different circuit boards which may be selectively inserted into the at least one clamping element of the clamping system. With such a modular terminal box system, the terminal box may include different control or regulation functions, which are determined by the respective circuit board clamped into the terminal box. For this reason, the functional scope of the terminal box may therefore be changed with such a design, by way of merely exchanging a circuit board of the terminal box. For example, one of the at least two circuit boards may include a controllable switch as is described above.

A terminal box system according to an embodiment of the invention alternatively or in the form of the previously described terminal box system, apart from the terminal box according to the preceding description, includes two different covers which may be selectively connected to the housing part of the terminal box. These covers may change the functional scope of the terminal box. For example the terminal box, depending on the inserted cover, may include different or a different number of electrical connection contacts and/or cable lead-throughs, with which further apparatus may be connected. Preferably, one of the two covers as an optional cover includes an electric connection contact, with which a controllable switch may be connected on a circuit board in the inside of the terminal box, as has been described above. Alternatively, the optional cover may include a lead-through for a cable connected to the controllable switch. Ideally, the terminal box system thereby includes two circuit boards, of which one circuit board, as an optional circuit board, includes the controllable switch and is fastened in the optional cover. In the design, an external apparatus may be connected via the optional cover onto the terminal box and may receive a signal of the controllable switch in dependence on the operating condition of the electric motor, via the controllable switch of the optional circuit board. For this, the optional cover of the terminal box system with the optional circuit board is merely to be inserted into the terminal box. The circuit board is contacted by a clamping element as described above.

The pump assembly according to an embodiment of the invention is preferably a circulation pump assembly. This pump assembly according to an embodiment of the invention includes a terminal box or a terminal box system as previously described.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

The invention is hereinafter described in more detail by way of one embodiment example represented in the drawing. There are shown in the drawings.

DETAILED DESCRIPTION OF THE INVENTION

Figure 1:
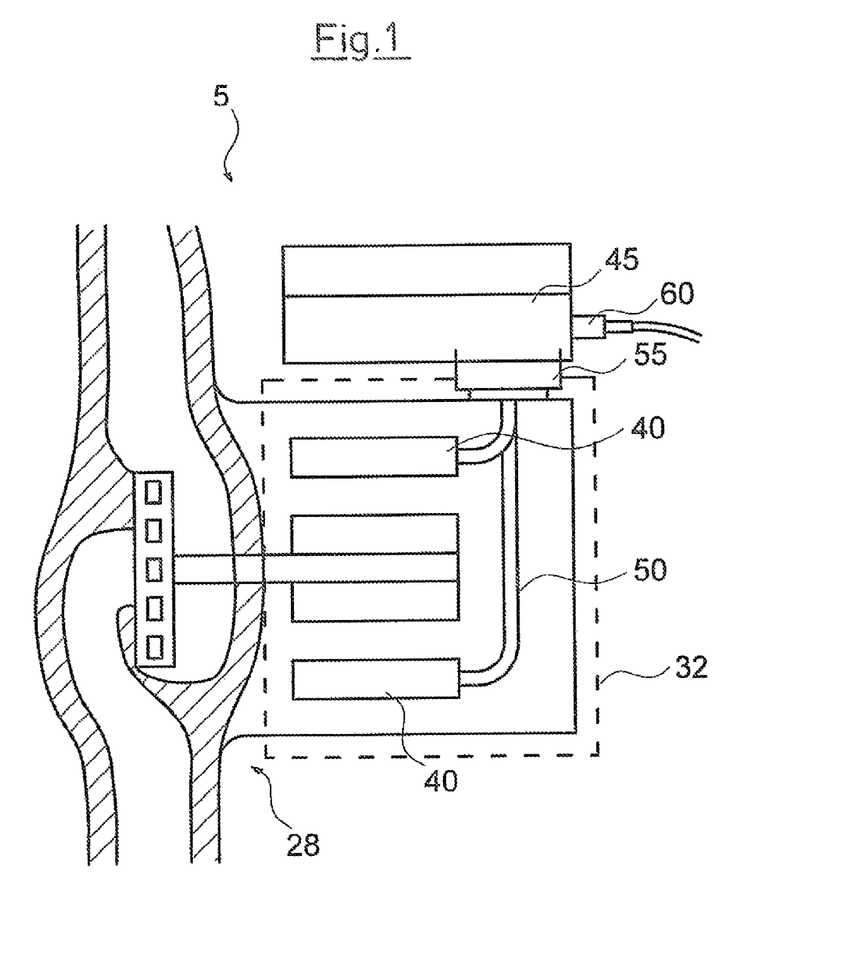
FIG. 1 is schematically, a heating circulation pump assembly according to an embodiment of the invention, with a terminal box according to an embodiment of the invention.

With regard to the pump assembly according to an embodiment of the invention represented in FIG. 1, it is the case of a heating circulation pump assembly 5 with an electric motor 32. Moreover, the electric motor 32 includes a stator 40 which is fed with electrical energy by a terminal box 45 according to an embodiment of the invention. Additionally, the electronics of the terminal box 45 assume the control and monitoring of the electric motor 32. For this, the stator 40 of the electric motor 32 is connected to an electrical plug contact region 55 of the terminal box 45 via electrical leads 50. The terminal box 45 is connected to a voltage source (not represented in the drawing) via an electrical plug contact region 60 for the supply with electrical energy.

Figure 2:
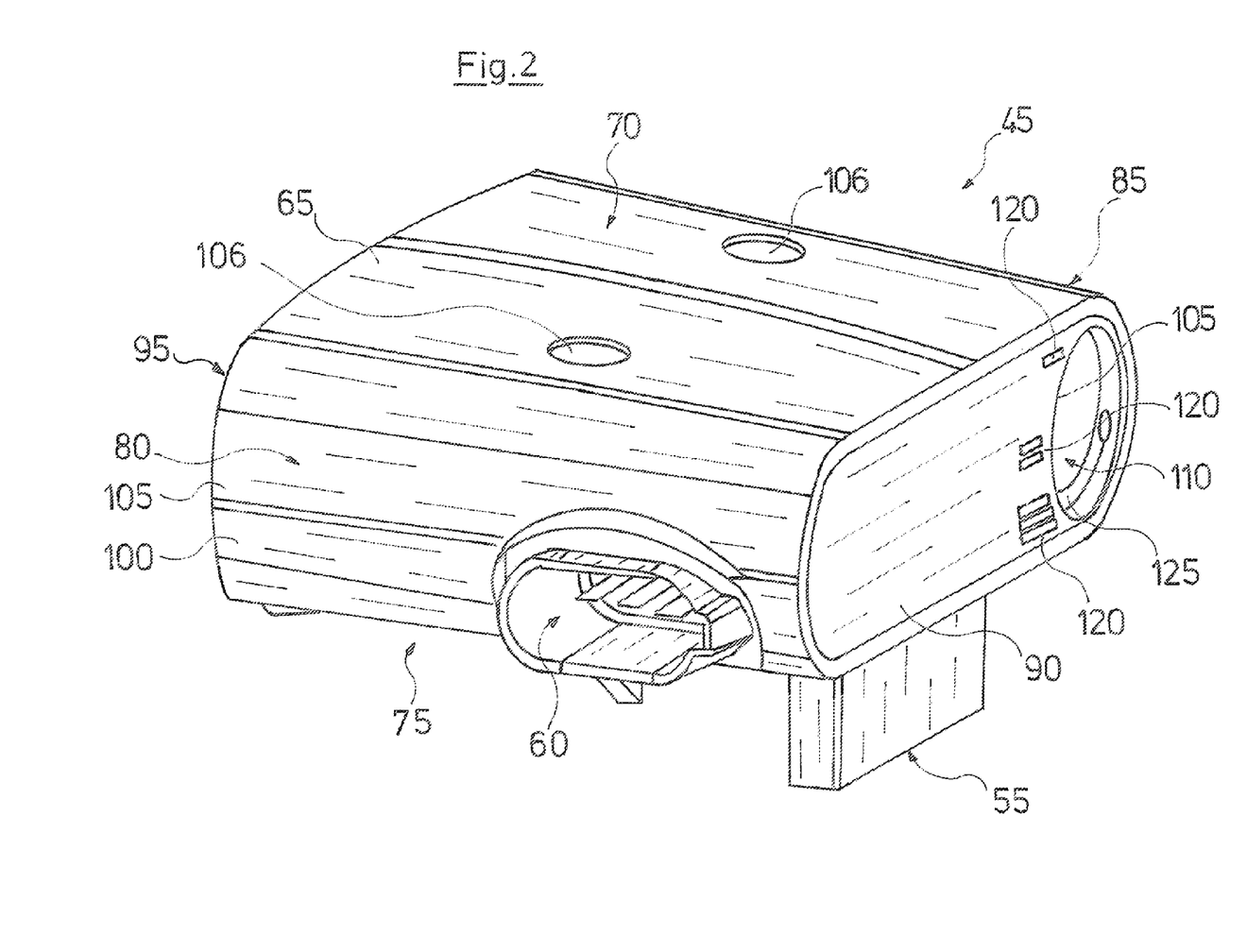
FIG. 2 is the terminal box according to FIG. 1, in a perspective representation.

The terminal box 45 as shown in FIG. 2, includes a housing 65 which essentially has the shape of a flat parallelepiped. The flat side 70 thereby forms the cover side or upper side of the housing 65 which is distant to the electric motor 32, and the flat side 75 forms the motor-side, i.e. the base side or lower side of the housing 65, which faces the electric motor 32. The two shorter narrow sides 80, 85 of the housing 65 are rounded to the outside and have the shape of a cylinder jacket which is divided along its longitudinal middle plane. The two longer narrow sides of the housing 65 are designed in a plane manner and form the front side 90 and the rear side 95 of the terminal box 45.

The housing 65 is composed of a motor-side housing part in the form of a base part 100 and of a cover 105, which are connected to one another in a releasable manner by way of screws (not represented in the drawing). The cover 105 on its upper side 70 includes two lead-throughs 106, through which the screws may be screwed in holes 108 on the lower side 75 of the base part 100. The housing 65 may thereby be separated along the longitudinal middle plane parallel to the upper side and lower side 70, 75, into the base part 100 and cover 105. The front side 90 thereby is firmly connected to the base part 100. The electrical plug contact region 55 for the connection to the electric motor 32, projects perpendicularly outwards on the lower side 75 of the base part 100. The electric plug contact region 60 for connection to a voltage source projects laterally perpendicularly to the outside on a shorter narrow side 80 of the base part 100.

A rotational speed selection switch in the form of a rotary switch 110 is arranged on the front side 90 of the terminal box 45, for the selection of the rotational speed of the electric motor 32. The rotary switch 110 includes a rotation body 115 which is designed in a circularly cylindrical manner, which with an end-face 114 faces the housing 65, and which is arranged in the housing in a rotationally movable manner. The rotation body 115 thereby is arranged close to a shorter narrow side 85 of the housing 65, so that the circular lateral area 116 of the rotation body 115 and the outwardly curved narrow side 85 of the housing 65 are situated concentrically to one another. The terminal box 45 is designed in a space-saving manner by way of this. The rotation body 115 for this is located in a receiver 117 in the form of a circularly cylindrical recess on the front side 90 of the base part 100.

Markings 120 are incorporated close to the rotation body 115 on the front side 90 of the housing 65, on which a corresponding marking 125 of the rotation body 115 may come to bear, depending on the rotational position of the rotation body 115. A suitable rotational position of the rotation body 115 for the selection of the rotational speed of the electric motor 32 may be read off by the user by way of these marking 120, 125.

Figure 3A:
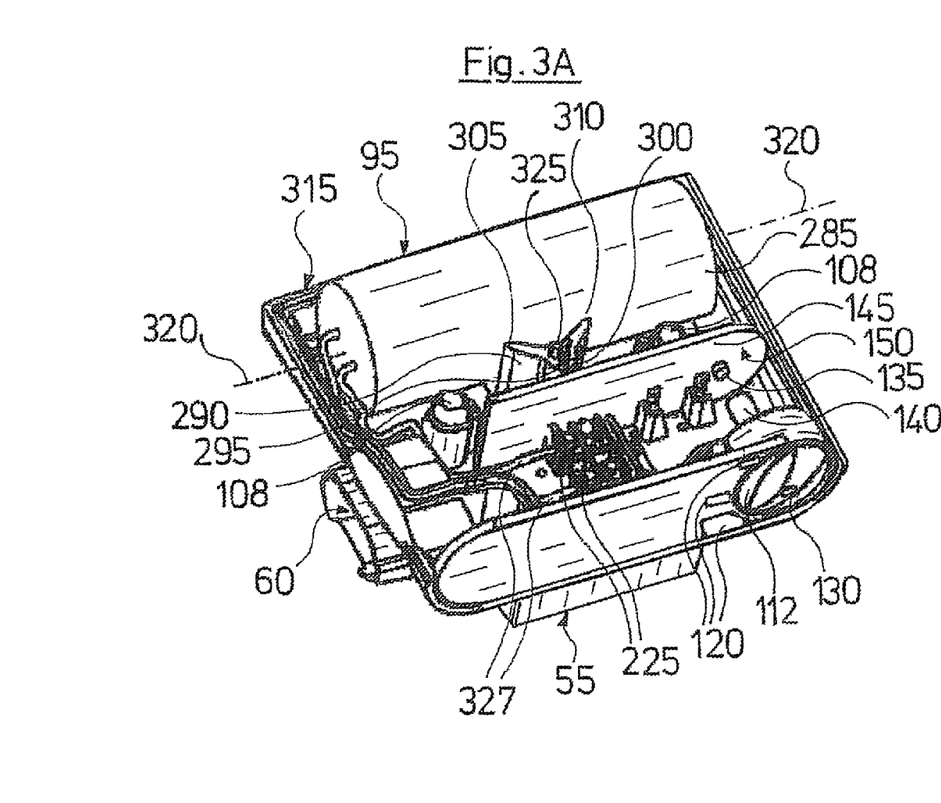
FIG. 3A is a base part of the housing of the terminal box according to FIG. 1, in a perspective representation.

A more detailed construction of the base part 100 may be deduced from FIG. 3A. A light display 130 is designed as a motor operation display in the centre of the rotation body 115 of the rotation switch 110, i.e. the light display 130 lights up when the electric motor 32 is operated. The light display 130 for this is illuminated by a light diode 135. For this, the light emitted by the light diode 135 is led through a shaft 140 of the rotation body 115, which is designed as a hollow shank and which is arranged in the centre of the rotation body 115 and which with its longitudinal axis extends perpendicularly to the front side 90 into the inside of the housing 65. Thus the cavity in the shaft 140 acts as a light-guide for the light emitted by the light diode 135. In the inside of the housing 65, the shaft 140 at an end-side 141 of the receiver 117 is rotatably held in a lead-through 142, so that the rotation body is rotatable in the receiver 117. The shaft 140 thereby ends in the inside of the housing 64 close to the light diode 135. The shaft 140 terminates with the light display 130 in a flush manner on the outwardly facing end-side of the rotation body 115. In this manner, the light diode 135 is connected to the light display 130 in a light-conducting manner and in a straight path, so that the light display 130 is illuminated by the light diode 135. Alternatively to the represented embodiment example, the light may also be led in the shaft 140 through a fixed transparent light-guide, for example of plastic, which is embedded in the hollow shank or itself forms the shaft.

The light is scattered to the outside by way of a scatter disk of the light display 130, which covers the face-end of the hollow shank, by which the light display 130 may be perceived as illuminating. The light diode 135 is arranged close to the opening of the shaft 140 which points to the inside of the housing, on a circuit board 145. Thereby, the light diode 135 is located on the side 150 of the two flat sides 150, 152 of the circuit board 145, said side facing the front side 90 of the terminal box 45. The circuit board 145, with its flat sides 150, 152 perpendicular to the lower side 75 and parallel to the front side 90, is clamped into the housing of the terminal box 45 (more detail with regard to the arrangement of the circuit board 145 is explained further below).

Figure 3B:
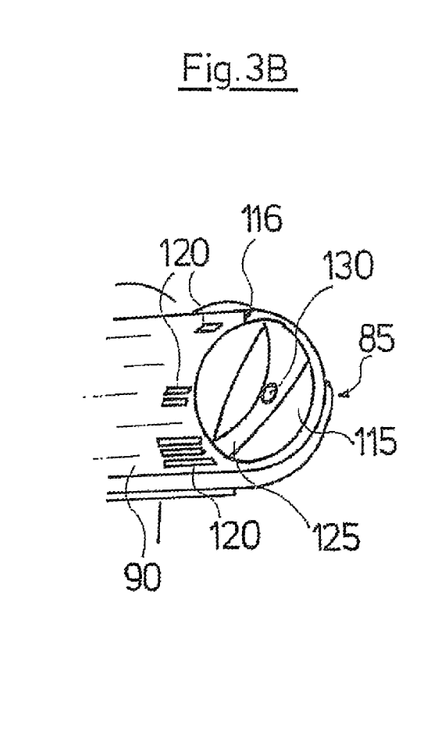
FIG. 3B is a rotational speed change switch of the base part of the housing according to FIG. 3A, in an enlargement.
Figure 4A:
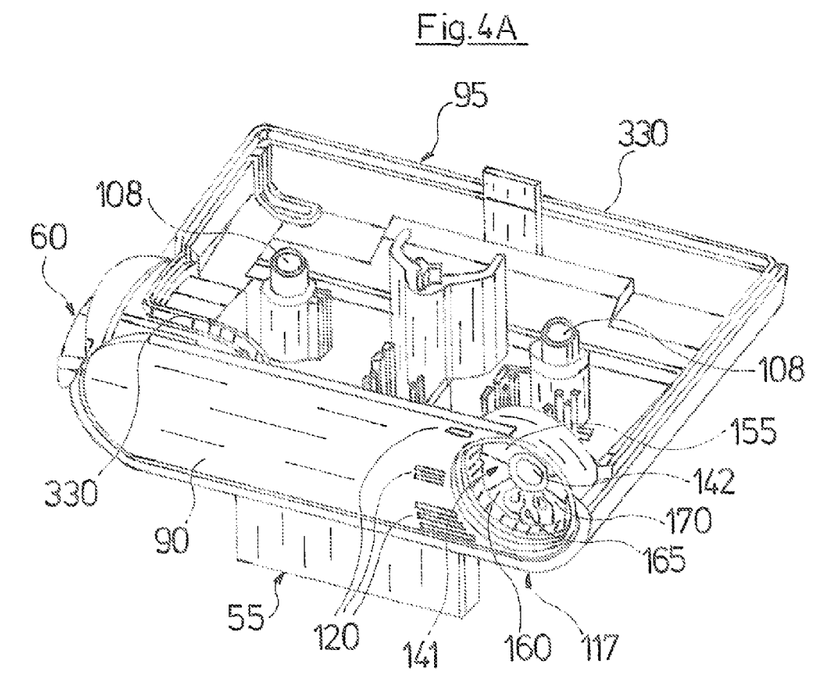
FIG. 4A is the base part according to FIG. 3A, in a perspective representation.
Figure 4B:
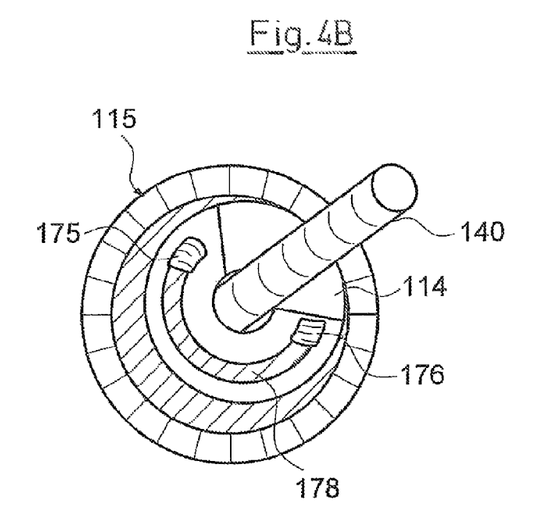
FIG. 4B is schematically, the moving part of the rotational speed change switch according to FIG. 3B.

Apart from the moving rotation body 115, the rotary switch 110 includes stationary electrical switch contacts 155, 160, 165, 170. The stationary electrical switch contacts 155, 160, 165, 170 are thereby grouped peripherally around the lead-through 142 for the shaft 140, at the end-side 141. The stationary switch contact 155 thereby covers a large angular range around the lead-through 142 which makes up almost 180°. The switch contacts 160, 165, 170 in contrast extend only over very narrow angular regions about the lead-through 142, and are equally distanced to one another and are distributed over the remaining periphery about the lead-through 142 with the same distance to the lead-through 142. One of three rotational speed steps of the electric motor 32 may be selected via the rotary switch 110, by way of one of the narrow-angled stationary contacts 160, 165, 170 being connected to the wide-angled stationary electrical switch contact 155 in an electrically conducting manner. For this, the rotation body 115 on its end-face 114 includes two rotationally movable switch contacts 175, 176 which are firmly connected to the rotation body. The switch contacts 175, 176 in each case assume just as small an angle about the shaft 140 as the narrow-angled, stationary electrical switch contacts 160, 165, 170, and are distanced similarly far from the shaft 140 as the stationary electrical switch contacts 160, 165, 170 from the lead-through 142. The two switch contacts 175, 176 thereby are arranged about the shaft 140 in a diametrically opposite manner and are connected to one another via a strip conductor 178, which runs around the shaft 140 on the end-face 114 of the rotation body 115 and covers a 180° angle. In this design then, one 176 of the two switch contacts 175, 176 which are rotatably movable with the rotation body 115 may come into contact with one of the narrow-angled, stationary electrical switch contacts 160, 165, 170. The second moving electric switch contact 175 thereby brushes over the wide-angled, stationary electrical switch contact 155. For this reason, one of three electrical switch configurations is selected, depending on the rotational position of the rotation body 115.

Moreover, a compression spring (not shown in the drawing) is arranged on the shaft 140, which impinges the shaft 140 with force in the direction to the inside of the housing. The rotationally movable contacts 175, 176 may be kept continuously in electrical contact with the stationary electrical contacts 155, 160, 165, 170 in this manner.

The stationary electrical switch contacts 155, 160, 165, 170 of the rotary switch 110 are cast into the base part 100 of the housing 65. The switch contacts 155, 160, 165, 170 thereby are part of a strip conductor system 180 represented in FIG. 5A. This strip conductor system 180 includes a thin and flatly designed system of strip conductors 185. The stationary electrical switch contacts 155, 160, 165, 170 of the rotary switch 110 thereby represent the end regions of individual strip conductors 185. The switch contacts 155, 160, 165, 170 are angled about 90° to the strip conducts 185 in a manner such that they lie in a common plane and together form a part of the end-side 141 of the receiver 117. The strip conductor system 180 includes further stationary electrical contacts which are designed as end regions of individual strip conductors 185. Thus a group 190 of electric contacts forms the electrical part of the electrical plug contact region 55 for the connection of the terminal box 45 to the electric motor 32. A further group 195 of electric contacts forms the electrical part of the electrical plug contact region 60 for the connection of the terminal box 45 to the voltage source.

Figure 5A:
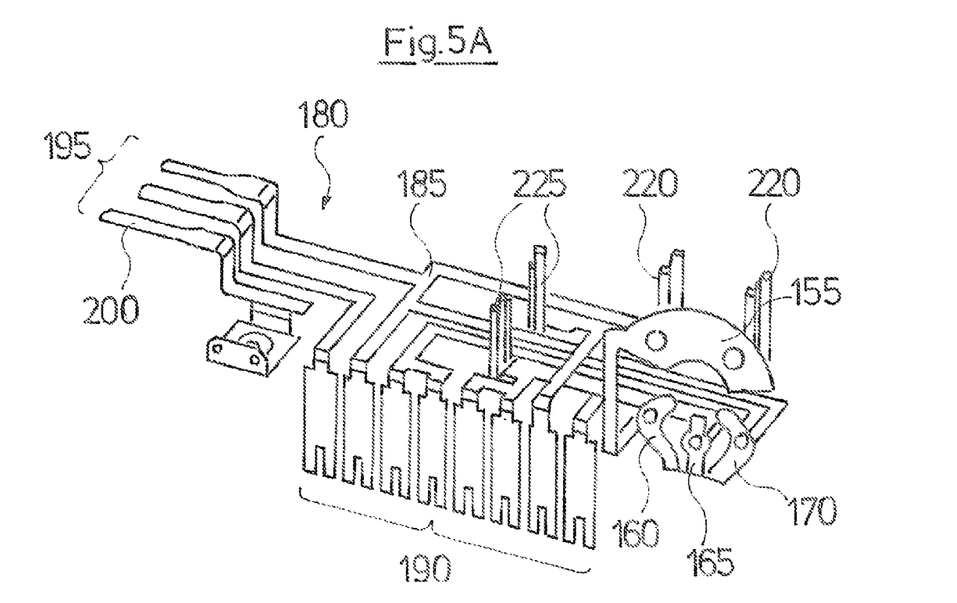
FIG. 5A is a strip conductor system of the base part according to FIG. 4A, with a switch contact of the operating switch before the pre-casting.

One electrical plug contact of the group of electrical plug contacts 195 thereby forms an earthing element 200 for earthing the connected electric motor 32. For this, the earthing element 200 is connected via the strip conductor system 180 to a contact surface 205 which is situated outside the motor-side base part 100 of the housing 65 of the terminal box 45. In the assembled condition of the terminal box 45, the contact surface 205 comes into electrical contact with the housing of the electric motor 32 by way of direct abutment. The contact surface 205 is provided with a lead-through 210 for supporting the electrical contact, through which a screw (not represented in the drawing) is led for fastening the terminal box 45 on the electric motor 32. The screw thereby presses the contact surface 205 against the housing of the electric motor 32 after the assembly of the terminal box 45 onto the electric motor 32.

The previously mentioned electrical contacts 155, 160, 165, 170 or groups of electrical contacts 190, 195 are in each case arranged on the outer regions of the strip conductor system 180 which is formed in a thin and flat manner. The strip conductor system 180 is cast into a wall or base surface 215 of the base part 100 of the housing 65 of the terminal box 45. The group 190 of electrical contacts angled away from the individual strip conductors 185 thereby projects downwards out of the motor-side base part 100 of the housing 65 of the terminal box 45, thus out of the lower side 75 of the housing 65 of the terminal box 45. The group 195 of electrical contacts projects laterally out of the narrow side 80 of the base part 100 of the housing 65, said narrow side being distant to the rotary switch 110. The electric contacts 155, 160, 165, 170 on the other hand form the end-side 141 of the receiver 117 and thus lie in the surface of the housing 65 of the terminal box 45. Apart from this, the strip conductor system 180 includes pairs 220, 225 of resilient clamping tongues which extend from the strip conductor system 180, in a manner in which they are orientated upwards perpendicular to the strip conductors 185, i.e. orientated perpendicular to the base surface 215 of the base part 100 of the housing 65 and into the inside of the terminal box 45. The pairs 220, 225 of resilient clamping tongues thereby also represent electrical contacts, which however in contrast to the contacts mentioned above are situated in the inner region of the terminal box 45. This will be dealt with in more detail hereinafter.

Figure 5B:
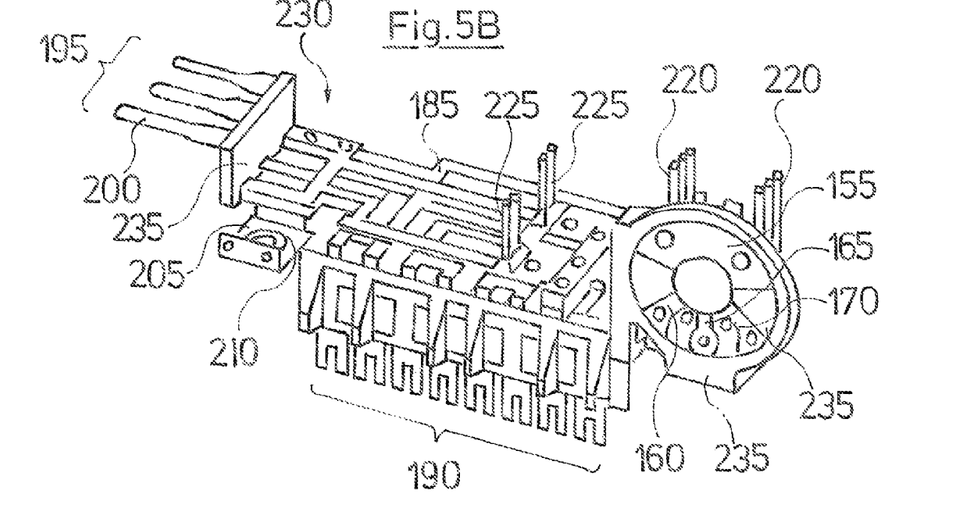
FIG. 5B is the strip conductor system according to FIG. 5A, after the pre-casting.

As is shown in FIG. 5B, the strip conductor system 180 is not cast directly into the base surface 215. Rather, the individual strip conductors 185 are firstly pre-cast with one another into a module 230 which may be handled as a single-piece or single part. For this, the strip conductors 185 are partly peripherally injected with plastic 235. In this manner, the module 230 may be cast into the base surface 215 in a significantly simpler manner than it would be possible with a collection of individual strip conductors 185, which for this would have to be positioned individually in a tool.

Figure 6A:
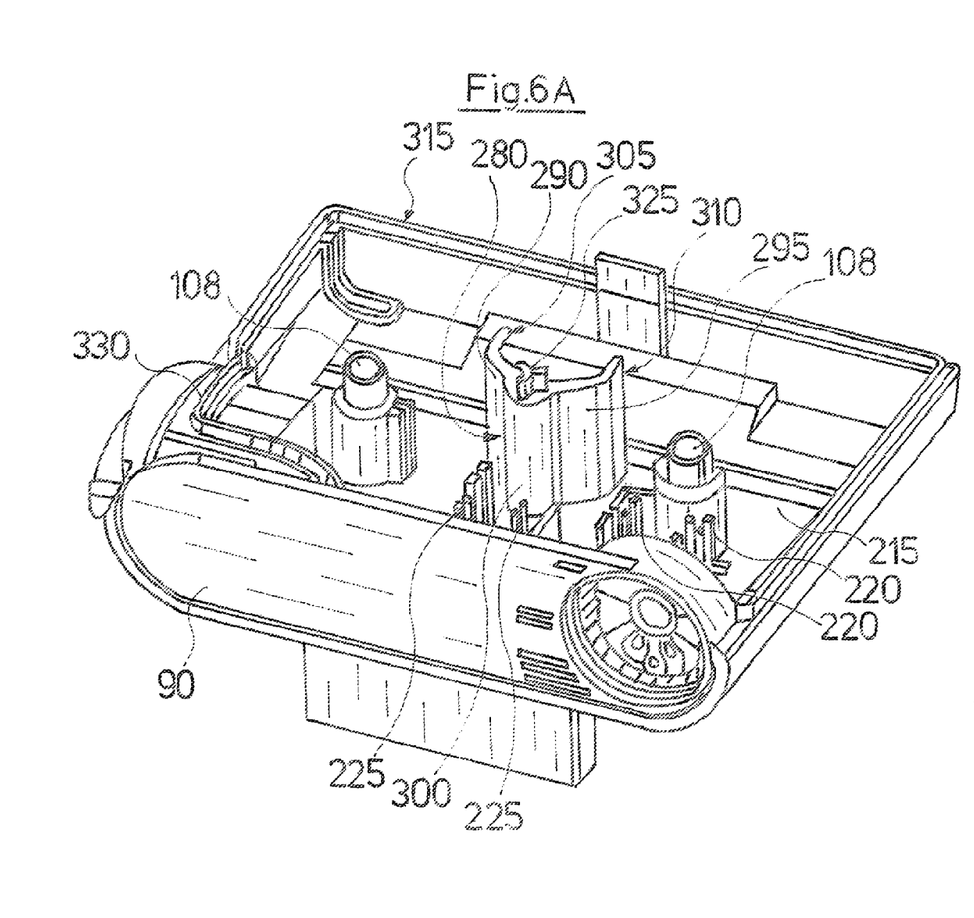
FIG. 6A is the base part of the housing of the terminal box according to FIG. 3A, in a perspective representation.
Figure 6B:
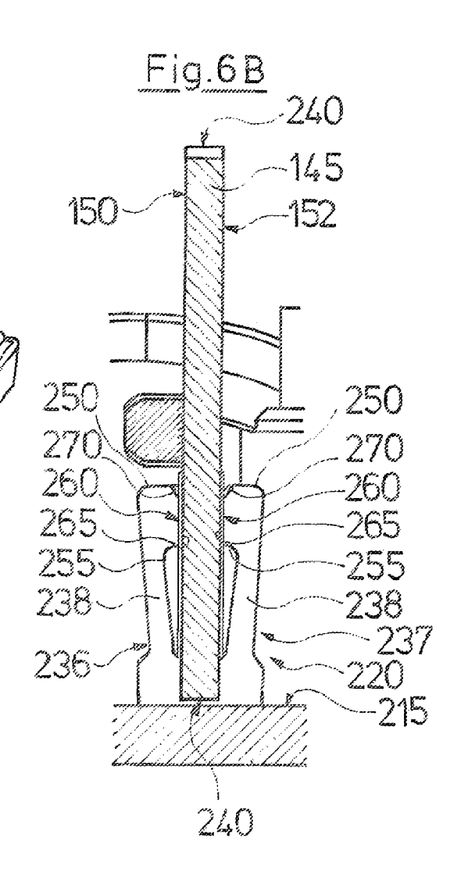
FIG. 6B is a clamping element of the base part according to FIG. 3A, for clamping a circuit board, with a circuit board in an enlargement in section.

The design of the pairs 220, 225 of resilient clamping tongues may be deduced from FIG. 6A and FIG. 6B. The base part 100 of the housing 65 of the terminal box 45 is shown in FIG. 6A without the inserted circuit board 145. The pairs of resilient clamping tongues 220, 225 extend into the inside of the housing 65 of the terminal box 45 and perpendicularly to the base surface 215 away from this. The pairs 220 of resilient clamping tongues thereby serve for clamping the circuit board 145 and in each case include two clamping tongues 236, 237 which lie opposite one another. Two pairs 220 of clamping tongues are positioned along a plane which runs parallel to the front side 90 of the terminal box 45. In this manner, the circuit board 145 may be clamped perpendicularly to the base surface 215 and parallel to the front side 90 of the terminal box 45.

The clamping of the circuit board 145 by the clamping tongue pairs 220 is shown in a sectioned view in FIG. 6B. The circuit board 145 thereby is located in its clamping position in which it is orientated with its flat sides 150, 152 perpendicularly to the base surface 215. Thereby, it is orientated with the direction of its longest extension, parallel to the front side 90 and to the base surface 215 of the housing 65 of the terminal box. In the sectioned view represented in FIG. 6B, the front side 90 of the terminal box 45 thereby is situated left of the circuit board 145. The narrow sides 240 of the circuit board are orientated parallel to the base surface 215 of the terminal box 45. The circuit board 145 is clamped on the two flat sides 150, 152 by pairs 200 of clamping tongues, of which one pair 220 is shown in a sectioned view. The clamping tongues 236, 237 of the clamping tongue pair 220 which lie opposite to one another, when the circuit board 145 is inserted, are situated on both sides on the flat sides 150, 152 of the circuit board 145 which are distant to one another. They are designed as resilient lugs 238 which extend essentially perpendicularly away from the base surface 215, and at their ends 250 which are distant to the base surface 215 in each case include a projection 255 which points to the flat sides 150, 152 of the circuit board 145 and whose side which faces the circuit board 145 forms an electrical contact surface 260. On clamping the circuit board 145, the contact surfaces 260 come into surfaced electrical contact with corresponding contact surfaces 265 of the circuit board 145. The electrical contact surfaces 265 are designed as part of the strip conductors which are located on the circuit board 145, and thus are located close to the lower narrow side 249 and on the flat sides 150, 152 of the circuit board 145.

The contact surfaces 260 of the clamping tongues 236, 237 are impinged by force against the contact surfaces 265 of the circuit board 145, by which means a secure retention and a reliable electrical contacting of the circuit board 145 are simultaneously ensured. The force impingement of the contact surfaces 260 in the direction of the circuit board 145 is thereby caused by the restoring force of the resilient lugs 238 of the clamping tongues 236, 237, which on inserting the circuit board 145, are deflected out of their idle position perpendicularly away from the flat sides 150, 152 of the circuit board 145.

The insertion of the circuit board 145 between the clamping tongues 236, 237 is carried out in a manner such that the circuit board 145 is moved perpendicularly towards the base surface 215. The clamping tongues 236, 237 are located in their idle condition before the circuit board 145 comes into contact with the clamping tongues 236, 237. In the idle position, the distance of the electrical contact surfaces 260 of the clamping tongues 236, 237 from one another, with these contact surfaces facing one another, is smaller than the thickness of the circuit board 145, thus the extension of the circuit board 145 perpendicular to its flat sides 150, 152. When the lower narrow side 240 of the circuit board 145 reaches the ends 250 of the clamping tongues 236, 237 which are distanced to the base surfaces 215, then on further movement of the circuit board 145 towards the base surface 215, the contact surfaces 260 of the clamping tongue pair 220 are pressed apart as a result of convex rounding 270 of the projections 255. Thereby, the clamping tongues 236, 237 at their ends 250 which are distant to the base surface 215, are deflected perpendicularly to the contact surfaces 260 or perpendicularly to the flat sides 150, 152 of the circuit board 145. The resilient lugs 238 of the clamping tongues 236, 237 thereby are bent apart at their sections which are remote from the base surface 215. A restoring force of the lugs 238 back into their idle position results from this bending of the lugs 238. For this reason, the contact surfaces 260 are impinged with force in the direction of the circuit board 145 via the lugs 238 of the clamping tongues 236, 237. The circuit board 145 thus with its flat sides 150, 152 comes into contact with the contact surfaces 260 of the clamping tongue pair 220. The contact surfaces 260 of the clamping tongue pair 220, on further movement of the circuit board 145 towards the base surface 215, brush over the flat sides 150, 152 of the circuit board 145, until they come into contact with the contact surfaces 265 of the circuit board 145. The contact surfaces 265 of the circuit board 145 lie flush in at least one flat side 150, 152 of the circuit board 145. Alternatively to this shown embodiment, the contact surfaces 265 of the circuit board 145 may also be designed as recesses in at least one of the flat sides 150, 152, so that the pair of clamping tongues 220 and the circuit board 145 are releasably and simultaneously firmly connected to one another via a locking connection.

The base part 100 moreover includes a holding device in the form of a clamping holder 280 for clamping a capacitor 285. In FIG. 6A, the base part 100 is represented without the inserted capacitor 285, and in FIG. 3A the capacitor 285 is clamped with the clamping holder 280. The clamping holder 280 for this is designed as a pair of two clamping limbs 290, 295 which in each case as a wall orientated perpendicular to the base surface 215, project upwards away from the base surface 215. The two clamping limbs 290, 295 meet in a common apex edge 300 which faces the front side 90 of the terminal box 45. The edges of the clamping limbs 290, 295 which are distant to the front side 90 thereby form two clamping surfaces 305, 310 which are orientated perpendicularly to the base surface 215 and which clamp the capacitor 285 against the rear wall 315 of the base part 100, so that the longitudinal axis 320 of the capacitor 285 is orientated parallel to the rear side 315 of the base part 100.

The two walls 290, 295 thereby consist of an elastic plastic. The distance between the clamping surfaces 305, 310 of the clamping holder 280 and the rear side 315 of the base part 100 is selected somewhat smaller than the diameter of the capacitor 285 for clamping the capacitor 285. Thus the clamping surfaces 305, 310 are elastically deflected from this capacitor 285. On account of its elasticity, the plastic of the clamping surfaces 305, 310 exerts a restoring force onto the capacitor 285, which impinges the capacitor 285 into the clamping position in the direction of the rear side 315 of the base part 100.

The two walls 290, 295 at their common apex edge 300 encompass a fastening rod 325 which with its star-shaped profile extends perpendicularly from the base surface 215. In this manner, the two walls 290, 295 are fastened on the base surface 215 in a rotationally fixed manner and thus in a rotationally fixed manner on the base part 100 of the housing 65.

The capacitor 285 is connected to the circuit board 145 via electrical lead cables 327. The lead cables 327 are clamped on the base part 100 of the housing 65 of the terminal box 45 via the pairs 225 of clamping tongues. The clamping of the lead cables 327 in the pairs 225 of clamping tongues is thereby effected in a similar manner as the previously described clamping of the circuit board 145 in the pairs 220 of clamping tongues. The electrical leads of the cables are clamped between the clamping tongues 225, which may additionally be designed in a cutting manner, in order to engage into the lead with a positive fit.

A seal 300 of an elastic plastic is integrally injected along the joint region of the base part 100, for the water-tight connection of the base part 100 to the cover 105. This seal 330 and the walls 290, 296 of the clamping holder 280 for the capacitor 285 are thereby manufactured together of the same elastic plastic as a second component in two-component injection moulding, wherein the housing 65 is formed of the first component.

Figure 7:
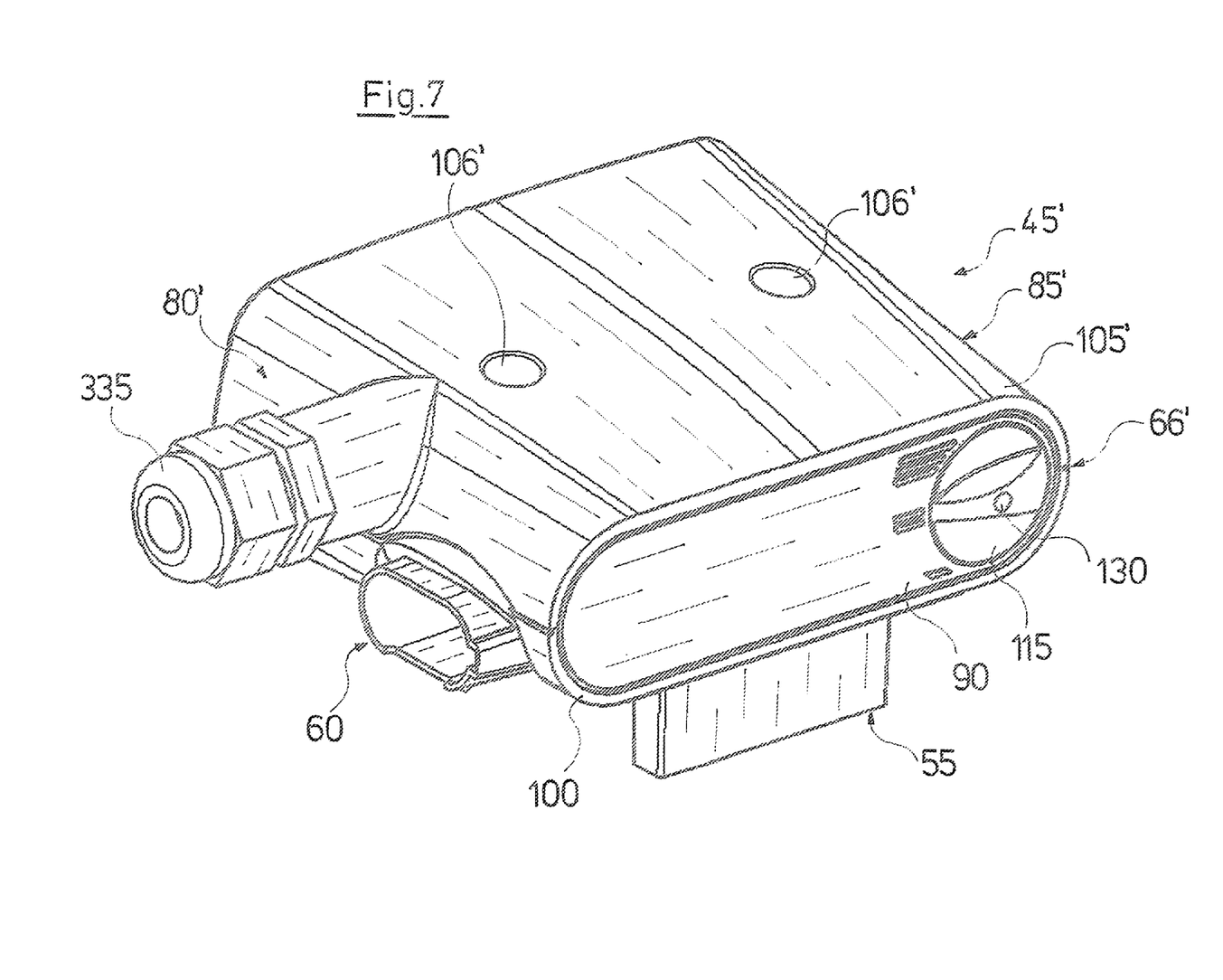
FIG. 7 is the base part according to FIG. 3A, with a second cover of a terminal box system according to an embodiment of the invention, in a perspective representation.
Figure 8:
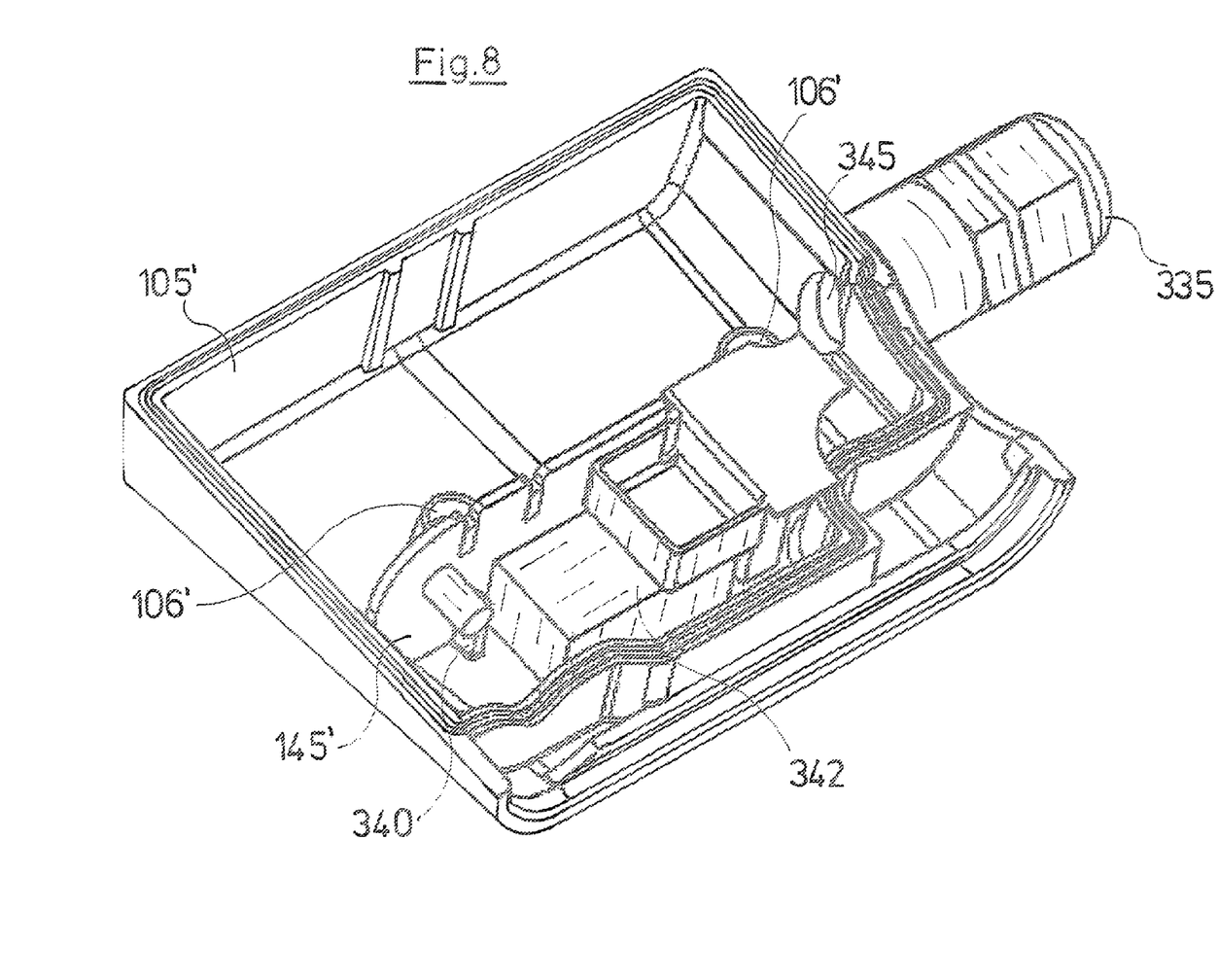
FIG. 8 is the second cover according to FIG. 7, in a perspective representation.

The previously described terminal box 45 is part of a terminal box system, which apart from the already described terminal box 45, includes a second cover 105' which includes an additional cable lead-through 335 (FIGS. 7 and 8). As is represented in FIG. 7, this additional second cover 105' may be joined with the base part 100 into a housing 65' of an extended terminal box 45', which is different from the housing 65. Additionally to the cable lead-through 335, the second cover 105' has its own, second circuit board 145' which takes the place of the first circuit board 145 when the covers 105, 105' are exchanged. For this, the circuit board 145 in the cover 105 as well as the circuit board 145' in the second cover 105' are firmly attached via a fastening means 340 as represented in FIG. 8. By way of placing the cover 105 or 105' onto the base part 100, at the same time the circuit board 145 or 145' comes into contact with the pairs 220 of clamping tongues 236, 237 of the base part 100 as previously described. Accordingly, the circuit board 145 or 145' is exchanged by way of a change of the cover 105 or 105'. Thereby, the second circuit board 145' has a functional scope which is changed with respect to the first circuit board 145. Thus a controllable switch, i.e. a relay 342, is attached on the second circuit board 145', whose control contact is connected to the electric plug contact region for the connection of the electric motor 55 and whose switch contacts are connected to cables (not shown in the drawings) which are led through the lead-through 335 as well as a lead through 345 of the second cover 105'. Thereby, the controllable switch on the second circuit board 145' switches a second pump assembly (not shown in the drawings) via the cables led through the lead-throughs 335, 345, e.g. if the electric motor 32 obtains no electrical current (not shown in the drawings).

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A terminal box for electrical connection to an electric motor of a circulation pump, comprising:
   a casting of at least one wall (215) of a housing (65) with at least one electrical contact therein; and
   at least one circuit board (145),
   wherein the at least one electrical contact (200) is a clamping element (220) releasably clamping the circuit board (145) which is orientated with flat sides (150, 152) thereof perpendicularly to the at least one wall (215), and
   wherein the clamping element (220) is designed as a pair (200) of resilient clamping tongues (236, 237) which extend perpendicularly from the at least one wall (215) and by way of which the circuit board (145) is clamped on its flat sides (150, 152).

2. A terminal box according to claim 1, wherein the circuit board (145) on at least one of its flat sides (150, 152) comprises at least one electric contact (265) for connection to the clamping element (220) which is arranged close to a side edge (240) of the circuit board (145).

3. A terminal box according to claim 1, wherein the clamping element (220) is part of a strip conductor system (180) which is cast into a housing (65) of the terminal box (45).

4. A terminal box according to claim 3, wherein the strip conductor system (180) comprises at least one of the following components:
   an electrical plug contact region (190) for connection of the electric motor (32),
   an electrical plug contact region (195) for connection to a voltage source,
   a stationary electrical contact (155, 160, 165, 170) of an operating switch (110),
   an electric contact for connection of a capacitor,
   an earthing element (200).

5. A terminal box according to claim 1, wherein the terminal box (45) comprises a holding device (280) for clamping a capacitor (285), said holding device being formed of an elastic plastic.

6. A terminal box according to claim 5, wherein the terminal box (45) comprises a first housing part (100) and a cover (105) which is releasable therefrom, with a seal (330) lying therebetween, and that the seal (330) and the holding device (280) are formed from the same material and together with the first housing part (100) of the terminal box (45) are formed as a multi-component injection moulding part.

7. A terminal box according to claim 1, wherein the terminal box (45) comprises a first housing part (100) and a cover (105) which is releaseable therefrom, and the circuit board (145) is fastened on the cover (105).

8. A terminal box according to claim 1, wherein the terminal box (45) comprises a first housing part (100) and a cover (105) which is releaseable therefrom, and at least one electrical contact together with at least one strip conductor is arranged on the cover (105).

9. A terminal box according to claim 8, wherein the at least one strip conductor is cast into the cover.

10. A terminal box according to claim 1, wherein the terminal box (45) comprises a first housing part (100) and a cover (105) which is releaseable therefrom, and at least one cable lead-through (345) and/or an electrical plug contact is arranged on the cover (105).

11. A terminal box according to claim 1, wherein the clamping element (220) for the circuit board is arranged on a housing part (100), which is provided for connection to the electric motor (32).

12. A terminal box according to claim 1, wherein the circuit board (145) comprises a controllable switch (342), comprising at least one control contact, which is connected to an electric plug contact region (190) for the connection of the electric motor (32), and at least one switch contact, which is connected to an electrical contact region of the terminal box.

13. A terminal box system with a terminal box according to claim 1, wherein the terminal box system comprises at least two different circuit boards (145, 145') selectively insertable into the at least one clamping element (220) of the terminal box (45).

14. A terminal box system with a terminal box according to claim 1, wherein the terminal box system comprises at least two different covers (105, 105') selectively connectable to a housing part (100) of the terminal box (45).

15. A pump assembly comprising the terminal box (45) terminal box system according to claim 1.

16. A pump assembly comprising the terminal box system according to claim 3.

17. A pump assembly comprising the terminal box system according to claim 15.

* * * * *